(12) United States Patent
Shen

(10) Patent No.: US 8,024,644 B2
(45) Date of Patent: Sep. 20, 2011

(54) COMMUNICATION SIGNAL DECODING

(75) Inventor: Qiang Shen, San Diego, CA (US)

(73) Assignee: VIA Telecom Co., Ltd., George Town (KY)

( * ) Notice: Subject to any disclaimer, the term of this patent is extended or adjusted under 35 U.S.C. 154(b) by 1008 days.

(21) Appl. No.: 11/559,441

(22) Filed: Nov. 14, 2006

(65) Prior Publication Data

US 2008/0115031 A1    May 15, 2008

(51) Int. Cl.
*H03M 13/00* (2006.01)
(52) U.S. Cl. .......................... 714/774; 714/753
(58) Field of Classification Search .......... 714/753, 714/774
See application file for complete search history.

(56) References Cited

U.S. PATENT DOCUMENTS

| | | | | |
|---|---|---|---|---|
| 5,996,104 A * | 11/1999 | Herzberg | | 714/755 |
| 6,161,209 A * | 12/2000 | Moher | | 714/780 |
| 6,518,892 B2 * | 2/2003 | Shen et al. | | 341/50 |
| 6,686,853 B2 * | 2/2004 | Shen et al. | | 341/50 |
| 6,738,948 B2 * | 5/2004 | Dinc et al. | | 714/794 |
| 6,871,303 B2 * | 3/2005 | Halter | | 714/702 |
| 6,888,901 B2 * | 5/2005 | Yu et al. | | 375/341 |
| 6,996,194 B2 * | 2/2006 | Pukkila et al. | | 375/340 |
| 7,092,464 B2 * | 8/2006 | Mills | | 375/346 |
| 7,093,180 B2 * | 8/2006 | Shin et al. | | 714/755 |
| 7,415,001 B2 * | 8/2008 | Naguleswaran et al. | | 370/347 |
| 7,454,684 B2 * | 11/2008 | Allpress | | 714/755 |
| 2001/0052104 A1 * | 12/2001 | Xu et al. | | 714/792 |
| 2002/0122423 A1 * | 9/2002 | Mukhopadhyay et al. | | 370/394 |
| 2002/0147954 A1 * | 10/2002 | Shea | | 714/755 |
| 2003/0084398 A1 * | 5/2003 | Nguyen | | 714/786 |
| 2004/0199848 A1 * | 10/2004 | Tamesue et al. | | 714/758 |
| 2004/0234007 A1 * | 11/2004 | Mills | | 375/340 |
| 2005/0111564 A1 * | 5/2005 | Kramer et al. | | 375/265 |
| 2007/0113143 A1 * | 5/2007 | Liao et al. | | 714/753 |
| 2007/0124657 A1 * | 5/2007 | Orio | | 714/794 |
| 2008/0115038 A1 * | 5/2008 | Kee et al. | | 714/760 |

OTHER PUBLICATIONS

Wolf et al. "An Exact Evaluation of the Probability of Undetected Error for Certain Shortened Binary CRC Codes." QUALCOMM, Inc. San Diego, CA 92121. 1988 IEEE. pp. 287-292.

Hagenauer et al. "Iterative Decoding of Binary Block and Convolutional Codes." IEEE Transactions on Information Theory, vol. 42, No. 2, Mar. 1996 pp. 429-445.

Zhai et al. "Techniques for Early Stopping and Error Detection in Turbo Decoding." IEEE Transactions on Communications. vol. 51, No. 10, Oct. 2003 pp. 1617-1623.

Shao et al. "Two Simple Stopping Criteria for Turbo Decoding." IEEE Transactions on Communications. vol. 47, No. 8, Aug. 1999 pp. 1117-1120.

* cited by examiner

*Primary Examiner* — M. Mujtaba Chaudry
(74) *Attorney, Agent, or Firm* — James W. Huffman

(57) ABSTRACT

Provided are systems, methods and techniques that use an embedded error-detection code within a received communication signal to determine when to stop iterative decoding of the communication signal.

21 Claims, 5 Drawing Sheets

COMMUNICATION SIGNAL DECODING

FIELD OF THE INVENTION

The present invention pertains to the decoding of communications signals and is particularly, although not exclusively, applicable to faster turbo decoding at a wireless receiver and to situations in which the format of a received communication signal is not unambiguously known at the receiver.

BACKGROUND

In communication systems, such as illustrated in FIG. 1, a transmitter 10 sends information to a receiver 12 via a communication channel 14. Of course, for bidirectional communications between two physically separated units, each unit functions alternately as both a transmitter 10 and a receiver 12.

One problem which any communication system has to address is the potential for loss of information in communication channel 14, e.g., due to fading, noise and other communication channel imperfections. In order to reduce the likelihood of such information loss, it has become common in the design of communications systems to encode digital signals to be transmitted. Such encoding typically involves spreading the information contained in the data bits across a greater number of data bits so that if any are lost the information still potentially can be reconstructed. In practice, it is common to use a type of forward error-correction encoding in which the value of each binary output symbol is formed on the basis of multiple input bits.

Once such information spreading has been completed, the resulting symbols typically are interleaved, so as to ensure that correlated information symbols are not immediately adjacent to each other in the time-domain data stream. By so interleaving, the effects of short-term bursts of noise or fading eventually (after subsequent de-interleaving) are distributed over multiple bits. The end result is that the probability that any particular original information bit cannot be recovered at the receiving end is significantly reduced, meaning more accurate reproduction at the receiving side of the communication channel.

One type of forward error-correction encoding that has become prevalent is turbo coding. A simplified block diagram of a system 20 for implementing one example of turbo coding is illustrated in FIG. 2. As shown in FIG. 2, input into system 20 is a sequence of information bits 22 to be communicated. Information bits 22 are supplied directly to first constituent encoder 24 and are supplied to second constituent encoder 28 via temporal interleaver 26. Encoders 24 and 28 are identical. Temporal interleaver 26 is a block interleaver, meaning that it interleaves bits in fixed-length segments (or blocks) such that the bits of each such block are interleaved independently of any other block, but with the interleaving pattern typically being identical across all blocks. The precise details of the operation of interleaver 26 and encoders 24 and 28 are not critical to the present invention and therefore are not discussed here. However, each encoder 24 and 28 outputs two symbols for each input bit. Thus, encoder 24 outputs symbols Y0 and Y1 and encoder 28 outputs symbols Y0' and Y1'. Output symbol X is identical to the input bit. Accordingly, the X, Y0, Y1, Y0' and Y1' symbols (the turbo code) are produced for each input bit.

The turbo code generated in the foregoing manner is first provided to a channel interleaver 30 which interleaves the coded output symbols and sometimes punctures certain of the symbols to insert control signals or other data. Thereafter, the resulting symbols can be processed for transmission, such as by performing quadrature phase-shift keying modulation.

An iterative decoder 50 for decoding the symbols generated by system 20 is illustrated in FIG. 3. Initially, channel de-interleaver 52 zeroes any symbols punctured by channel interleaver 30 and then de-interleaves the symbols in order to reverse the interleaving performed by channel interleaver 30. For each input bit k in a frame of data, the received symbols X, Y0 and Y1, together with a feedback signal $\tilde{L}(u_k)$, are input into a posteriori probability (APP) decoder 54. On the first iteration performed by decoder 50, $\tilde{L}(u_k)$ is zero for all values of k. Upon completion of its decoding operation, APP decoder 54 outputs a soft value $\tilde{L}(\hat{u}_k)$ for each value of k. $\tilde{L}(\hat{u}_k)$ is then interleaved in interleaver 56 to provide $\tilde{L}(u_n)$ which in turn is input into APP decoder 58, together with the Y0' and Y1' for the current block. The output of APP decoder 58, $\tilde{L}(\hat{u}_k)$, is then de-interleaved in de-interleaver 60. Finally, the output of de-interleaver 60, $\tilde{L}(u_k)$, is fed back into APP decoder 54, together with the X, Y0 and Y1 for the current block, for the next iteration of processing to be performed by decoder 50.

The foregoing process typically is repeated across multiple iterations. In this regard, it is noted that channel de-interleaver 52 makes available all X, Y0, Y1, Y0' and Y1' for each original input bit in the current block. After every iteration, as described above, the soft and feedback values $\tilde{L}(\hat{u}_k)$ and $\tilde{L}(u_k)$ are added together for each input bit k in adder 62. The output of adder 62, $L(\hat{u}_k)$, known as the log likelihood ratio (LLR), is then input into hard decision module 64 to provide a final decision for each bit. Typically, hard decision module 64 is implemented as a threshold detector.

As indicated above, turbo decoding requires multiple iterations of constituent code decoding. In general, using a greater number of iterations results in less decoding error. However, for speed and efficiency it often is desirable to reduce the number of iterations to the extent possible. For a packet of data being decoded, it is advantageous for the decoder to stop iteration when it determines that its performance can no longer be improved by further iterations or when a determination has been made that an error-free decoding already has been achieved.

There have been a number of approaches to determining the appropriate stop criteria when performing iterative decoding. However, each has its own drawbacks.

SUMMARY OF THE INVENTION

The present invention addresses this problem by using an embedded error-detection code within a received communication signal to determine when to stop iterative decoding.

Thus, in one embodiment, the invention is directed to a method of attempting to decode a communication signal, in which a communication signal that includes an embedded error-detection code is received. The communication signal is input into an iterative decoder that decodes the communication signal on an iterative basis, outputting decisions regarding values of the communication signal at each iteration. In addition, at each iteration a measure of error is calculated based on a parameter of the iterative decoder. At each iteration at which the measure of error passes a specified threshold test, a determination is made as to whether there is a detectable error in the decisions based on the embedded error-detection code. Finally, the iterations performed by the iterative decoder are stopped based on both of the following conditions occurring: (i) it is determined that there is no detectable error based on the embedded error-detection code, and (ii) the measure of error passes the specified threshold test. The specified threshold uses a threshold calculated in a predetermined manner based on the embedded error-detection code.

In another embodiment, the invention is directed to a method of simultaneously attempting to decode a communication signal and evaluate an assumed transmission format for the communication signal. Initially, a communication signal that includes an embedded error-detection code is received. The communication signal is input into an iterative decoder that decodes the communication signal on an iterative basis, outputting decisions regarding values of the communication signal at each iteration, based on an assumed transmission format. In addition, at each iteration a measure of error is calculated based on a parameter of the iterative decoder. At each iteration at which the measure of error passes a first specified threshold test, a determination is made as to whether there is a detectable error in the decisions based on the embedded error-detection code. The iterations performed by the iterative decoder are stopped and the assumed transmission format is selected based on both of the following conditions occurring: (i) it is determined that there is no detectable error, and (ii) the measure of error passes the first specified threshold test. The iterations performed by the iterative decoder are stopped and the assumed transmission format is de-selected based on the following condition occurring: the measure of error fails a second specified threshold test.

The foregoing summary is intended merely to provide a brief description of the general nature of the invention. A more complete understanding of the invention can be obtained by referring to the claims and the following detailed description of the preferred embodiments in connection with the accompanying figures.

DESCRIPTION OF THE PREFERRED EMBODIMENT(S)

Figure 1:
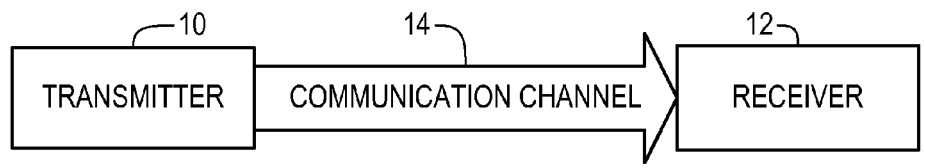
FIG. 1 provides a simplified block diagram of a communication system.
Figure 2:
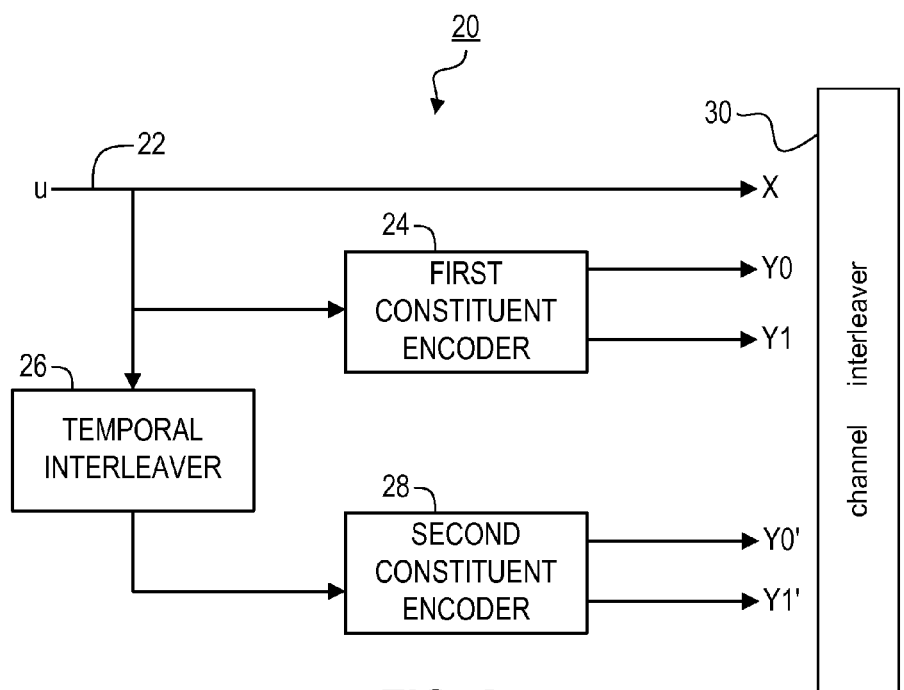
FIG. 2 is a block diagram illustrating a conventional turbo encoder.
Figure 3:
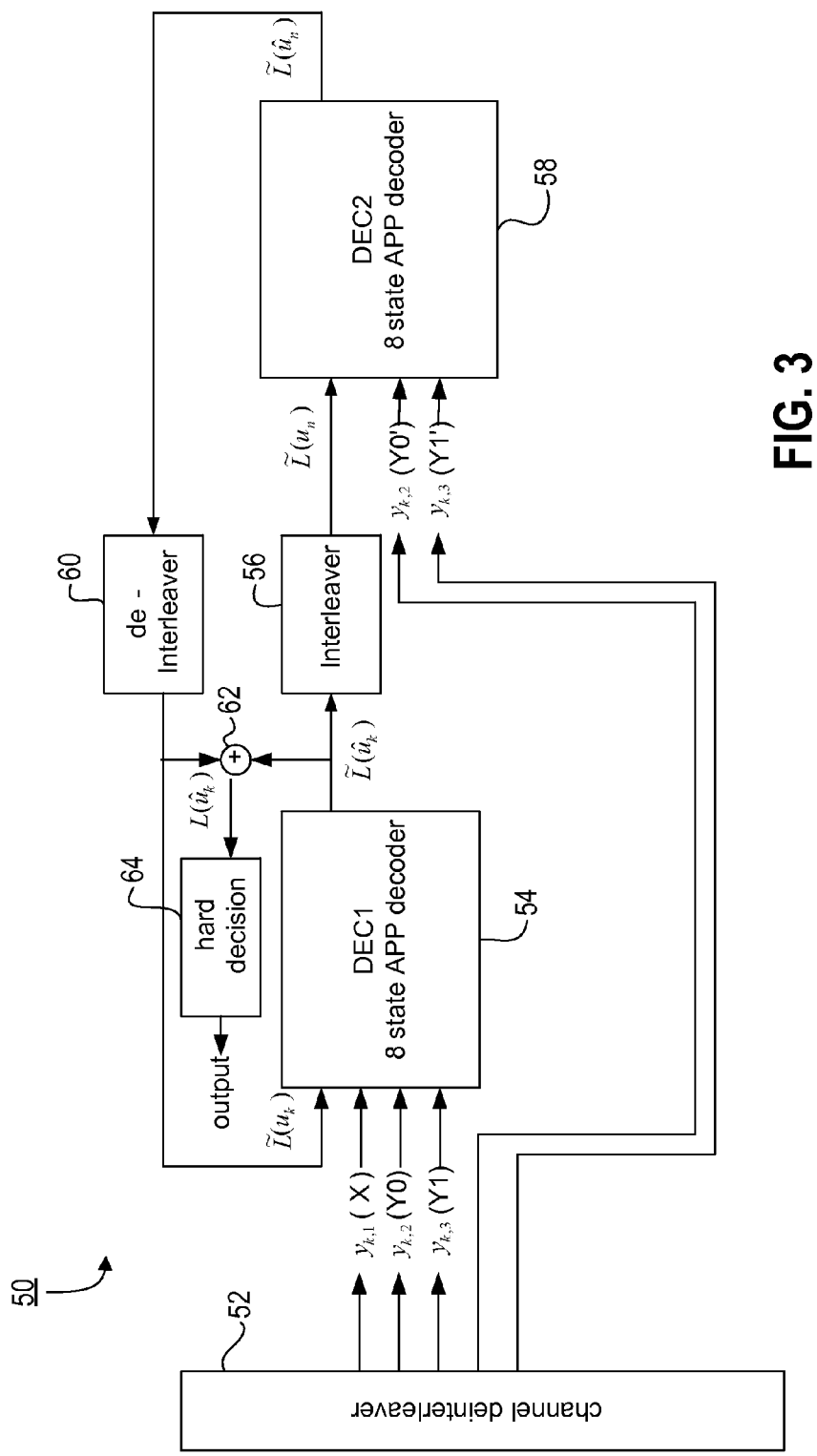
FIG. 3 is a block diagram illustrating a conventional iterative turbo decoder.
Figure 4:
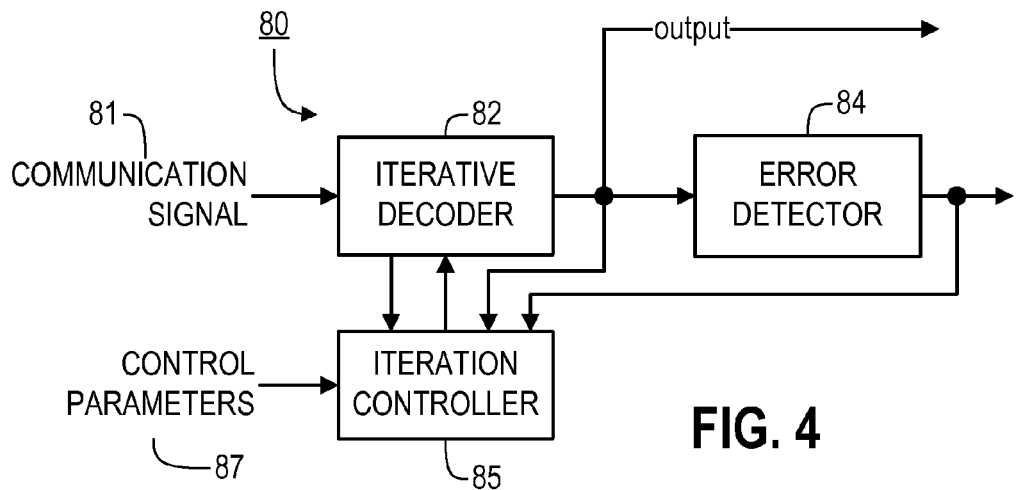
FIG. 4 illustrates a block diagram of a decoding system according to a representative embodiment of the present invention.

FIG. 4 illustrates a block diagram of a decoding system 80 according to a representative embodiment of the present invention. As shown in FIG. 4, a communication signal 81 is received and input by iterative decoder 82. For purposes of the present embodiment, it is assumed that decoder 82 is identical to turbo decoder 50, shown in FIG. 3. However, it should be understood that any other iterative decoder instead may be used, depending upon the expected type of encoding for the received communication signal 81.

The output decisions from decoder 82 are provided to error detector 84. As with decoder 82, the nature of error detector 84 will depend upon the expected type of encoding for received communication signal 81. In the preferred embodiments of the invention, communication signal 81 includes an embedded error-detection code. More preferably, the error-detection code is a cyclic redundancy check (CRC) code. Accordingly, in the present embodiment, error detector 84 performs a CRC check on the decoder decisions for each frame provided by decoder 82 in order to determine whether there appears to be a detected error in such frame. It is noted that the term "frame" is used in its generic sense, referring to a data block, segment or packet of a predetermined length.

As noted above, decoder 82 provides decisions at every iteration, generally improving the quality of its decisions with each subsequent iteration. Iteration controller 85, in turn, monitors data from decoder 82 and error detector 84, determining whether a further iteration is required or whether processing on the present frame can be halted, and controlling iterative decoder 82 accordingly. Additional details regarding the functionality provided by controller 85 are discussed in the more particularized embodiments described below.

In this regard, the main categories of embodiments of the present invention are: (i) where the transmission format of the received communication signal 81 is known, so that it is only necessary to decode the communication signal 81, if possible; and (ii) where the transmission format is unknown, so in addition to decoding the communication signal 81, a determination must be made as to which of a plurality of potential transmission formats has been used. As used herein, a transmission format is a set of parameters to form the transmitted data, which may include, e.g., coding rate or other encoding parameters, packet data size, modulation format and/or interleaving parameters.

When a frame-decoding operation according to the present invention is begun, it is provided with data format information (e.g. data packet size, code rate), and inputs information indicating whether such format information is known to be the format in which the data actually were transmitted or is simply a format that has been assumed. If the transmission format is known, the iteration control preferably is executed as described in the section below titled "Known Transmission Format". Otherwise, iteration control preferably is executed as described in the section below titled "Unknown Transmission Format".

Known Transmission Format.

Figure 5:
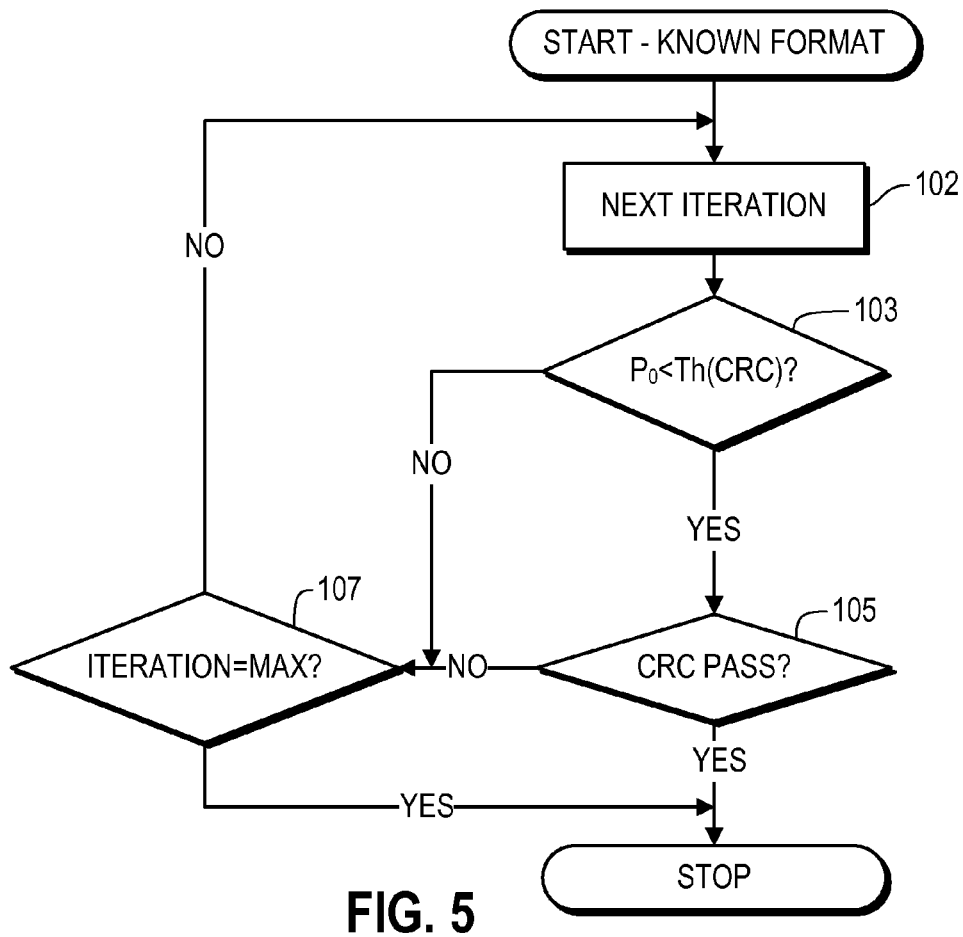
FIG. 5 is a flow diagram for explaining iteration-control processing, according to a representative embodiment of the present invention, where the transmission format of the received communication signal is known.

FIG. 5 is a flow diagram for explaining iteration-control processing, according to a representative embodiment of the present invention, where the transmission format of the received communication signal 81 is known in advance. Specifically, the processing shown in FIG. 5 preferably is performed within iteration controller 85.

Initially, in step 102 controller 85 causes decoder 82 to perform an iteration. Thus, for the initial execution of step 102 this will be the first decoding iteration performed by decoder 82.

Next, in step 103 controller 85 receives one or more decoding parameters for the current iteration from decoder 82, calculates a function of those parameters, and then determines whether the calculated value $P_0$ of the function passes a specified threshold test. Preferably, the calculated value $P_0$ comprises an estimate of bit error rate based on the log likelihood ratio (LLR) magnitudes across all bits in the data packet. As noted above in connection with the discussion of the exemplary decoder 50 illustrated in FIG. 3, the LLR is the final value input into hard-decision module 64 of iterative error-correction decoder 50, i.e., $L(\hat{u}_k)$. In the present embodiment, referring to the discussion below in the section titled "Mathematical Discussion", $P_0$ preferably is calculated as follows:

$$P_0 \approx \frac{1}{K}\sum_{k=1}^{K}\left\{\frac{1}{1+e^{|L(\hat{u}_k)|}}\right\} = \frac{1}{K}\sum_{k=1}^{K}\left\{\frac{1}{1+e^{M_k}}\right\},$$

where K is the number of bits in the data packet.

Figure 6:
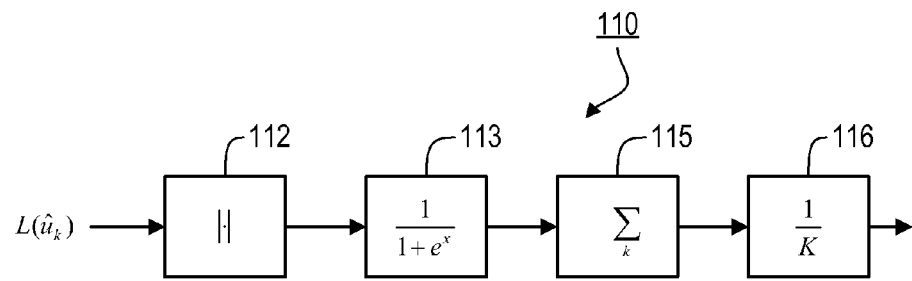
FIG. 6 illustrates a block diagram of a system for calculating an estimate of bit error rate, according to a representative embodiment of the present invention.

A system 110 for calculating $P_0$ is shown in FIG. 6. Input into the system 110 are the $L(\hat{u}_k)$ values, which have been output from adder 62 (shown in FIG. 3). Initially, the magnitudes denoted as x are taken in element 112. Then, the function $$\frac{1}{1+e^x}$$

is performed in element 113, with element 113 preferably implemented as a lookup table. Next, in element 115 the outputs from element 113 are summed across all k, and then in element 116 a division by K is performed.

Thus, in the preferred embodiments of the invention a threshold test of $P_0$ corresponds to a test of the estimated decoding bit error rate. For example, if $P_0$<Th, then the bit error decoding rate can be expected to be less than a rate corresponding to a threshold Th. Preferably, in this step 103 the applicable threshold Th is a function of the CRC that has been used, so that the threshold test is to determine whether $P_0$<Th(CRC). More preferably, Th is selected such that its corresponding bit error rate is equal to, or a function of, a specified undetected error rate for the CRC that has been used.

Figure 7:
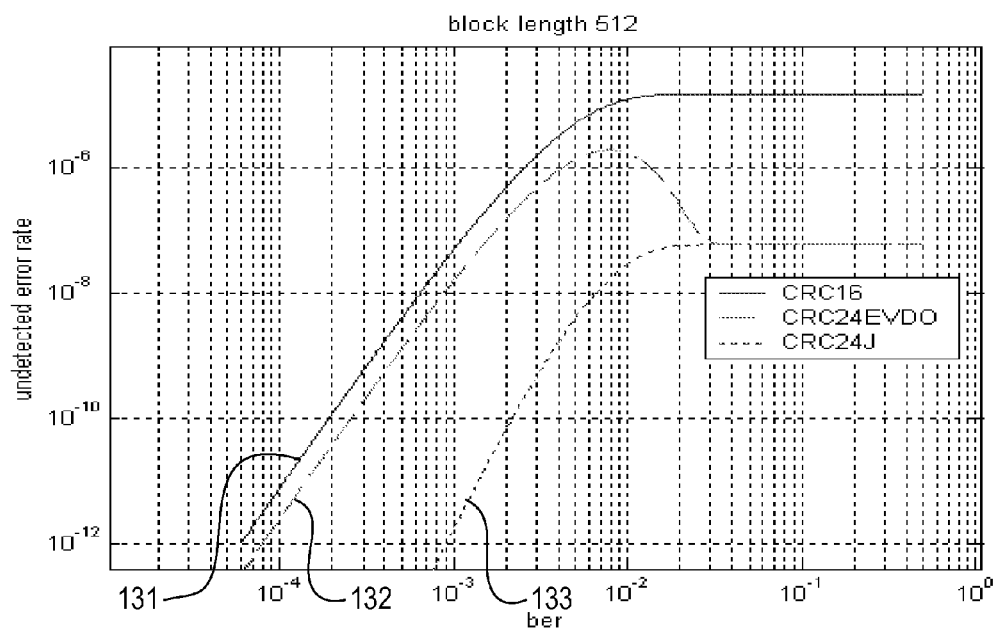
FIG. 7 is a graph illustrating the relationship between bit error rate and undetected error rate for three different CRCs.

In this regard, it is known that one can identify the relationship between the undetected error rate for a given CRC as a function of the underlying bit error rate. See, e.g., J. Wolf, R. Blakeney, "An exact evaluation of the probability of undetected error for certain shortened binary CRC codes," IEEE MILCOM 88, 23-26 Oct. 1988. As a result, for a given CRC, a specified undetected error rate can be mapped directly to a bit error rate. Exemplary curves 131-133 are shown in FIG. 7 for CRC16, CRC24EVDO and CRC24J, respectively. In FIG. 7, the x-axis is the actual bit error rate of the packet data, the y-axis is the probability of the CRC indicating that the data packet is error-free when in fact there is at least one error, and the subject CRCs have the following generator polynomials:

CRC16: $p(x)=x^{16}+x^{12}+x^{5}+1=(x+1)(x^{15}+x^{14}x^{13}+x^{12}+x^{4}+x^{3}+x^{2}+x+1)$

CRC24EVDO: $p(x)=x^{24}+x^{23}+x^{6}+x^{5}+x+1=(x+1)(x^{23}+x^{5}+1)$

CRC24J: $p(x)=(x+1)(x^{23}+x^{17}+x^{13}+x^{12}+x^{11}+x^{9}+x^{8}+x^{7}+x^{5}+x^{3}+1)$

Thus, the thresholding operation of this step 103 can be implemented to achieve a specified maximum undetected error rate (e.g., input as one of the control parameters 87) in the following manner. First, the specified maximum undetected error rate is mapped to a bit error rate, e.g., using the curve shown in FIG. 7 for the particular CRC that has been used. Then, the identified bit error rate, or some function of it (e.g., a specified fraction of such bit error rate, in order to provide a desired margin of error), is used as Th(CRC). For example, assuming a specified maximum undetected error rate of $10^{-8}$, further assuming that CRC16 has been used, and further assuming that one wishes to equate the bit error rates (with no margin of error), then reading directly from FIG. 7, Th(CRC)≈$6*10^{-4}$.

In the present case, the specified maximum undetected error rate preferably is input into system 80 (shown in FIG. 4) as one of the control parameters 87, e.g., by a user or by an automated process, e.g., that varies such parameters on a dynamic basis in an attempt to achieve optimal performance under varying conditions.

If the thresholding test of step 103 is satisfied, then processing proceeds to step 105. Otherwise, processing proceeds to step 107 (discussed below).

In step 105, a determination is made as to whether the embedded CRC code (or other error-detection code) indicates that the data block has been correctly received. If so, then processing is concluded and the iterations of the decoder 82 can be halted. Otherwise, i.e., if an error was detected, processing proceeds to step 107.

In step 107, a determination is made as to whether the maximum number of iterations has occurred. If not, then processing proceeds to step 102 to perform the next iteration. If so, then processing is concluded, with the output message that the data block either was received in error or cannot be determined to be error-free with sufficient confidence.

The foregoing embodiment of the invention uses a derived relationship between a parameter of the decoder 82 (i.e., the magnitudes of the turbo decoding LLRs in the present case) and the decoding bit error rate in order to estimate the bit error rate the decoder 82 is achieving. Then, by combining this estimate with a derived relationship between CRC error-detection probability and bit error rate, a threshold is established and used to decide whether the decoder 82 is at a stage where the CRC error detection probability is above a specified level. The embodiment in the following section uses similar concepts to also simultaneously determine whether a particular transmission format assumption is correct, incorrect, or uncertain.

In the foregoing processing, there is no need for a transmission-format-determination algorithm, and the early termination is based on both the $P_0$ measurement and a CRC check. If $P_0$ is less than a specified threshold, e.g., such that the CRC undetected error probability is small enough, then a CRC pass will cause an early termination of the turbo decoding. On the other hand, if the $P_0$ check does not pass, then iteration will continue till the pre-determined maximum iteration number, and the CRC check at the end of the iterations will be delivered to the upper layer, irrespective of whether the $P_0$ test passes or not. In this regard, the CRC check preferably is initially set to false so that if step 105 is never reached, the false value is delivered to the upper layer.

Unknown Transmission Format.

In addition to providing faster decoding, the techniques of the present invention also can be used to simultaneously identify the encoding format of the received data. In the CDMA2000 High Rate Packet Data system, for example, an access network (AN) can send an access terminal (AT) a packet of data with one out of a few possible transmission formats (packet size, modulation order, etc.). The AT needs to decide which one of the possible transmission formats actually was used during transmission by trying to demodulate and decode the received packet with each assumed transmission format.

This format-determination task can be performed by the turbo decoder. Generally speaking, if the turbo decoder can decode the packet with an assumed transmission format by passing the built-in CRC (cyclic redundancy check), then there is a high likelihood that the assumed format corresponds to the actual transmission format. However, CRC alone is not always the most efficient and reliable approach for format determination, because a CRC check has a non-zero error detection probability. On the other hand, even with respect to a packet for which the correct transmission format has been assumed, the CRC check still might not pass due to noise present in the received packet. Accordingly, it is desirable for the turbo decoder to utilize at least one additional measure when attempting to identify the transmission format.

Figure 8:
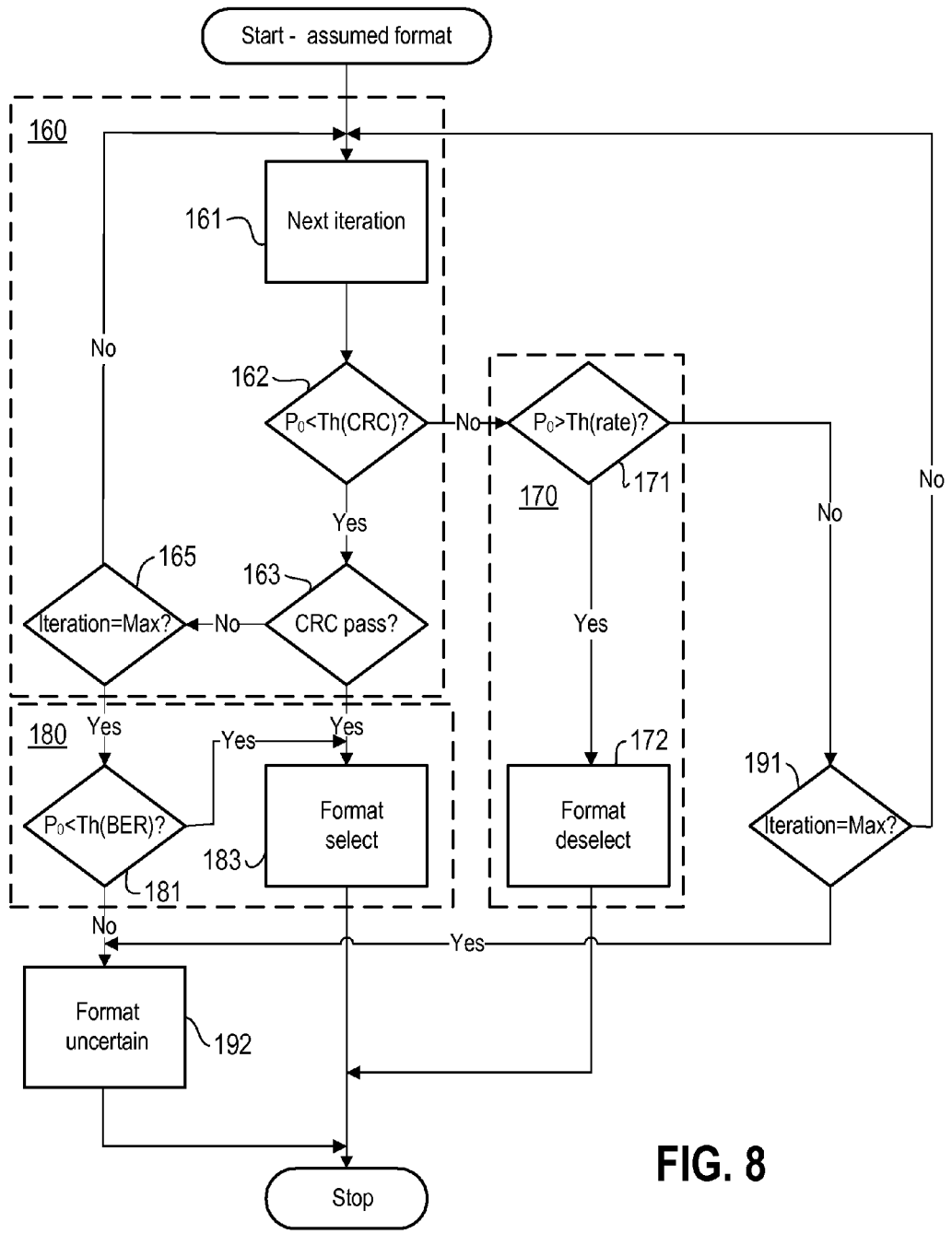
FIG. 8 is a flow diagram for explaining iteration-control processing, according to a representative embodiment of the present invention, where the transmission format of the received communication signal is not unambiguously known.

One technique for achieving this, according to a representative embodiment of the present invention, is shown in FIG. 8. Generally speaking, the technique illustrated in FIG. 8 can be divided into certain distinct processing sections 160, 170 and 180. Section 160 attempts to identify when iterations can be halted in a similar manner to the processing described above in connection with FIG. 5. However, one difference is that if the threshold test of step 162 (corresponding to the threshold test of step 103 in FIG. 5) is not satisfied, then processing section 170 attempts to determine whether the assumed format can be quickly rejected. In addition, processing section 180 provides a threshold test for confirming the assumed format even if the maximum number of iterations has occurred and the CRC check still has not passed.

In more detail, step 161 instructs decoder 82 to perform the first iteration or (for subsequent passes) the next iteration, in the same manner as step 102 (in FIG. 5).

Step 162 calculates a value $P_0$ and then determines whether it passes a specified threshold test. The same considerations apply to step 162 that applied to step 103 above and, accordingly, step 162 is not described in detail here. If the threshold test of step 162 passes, processing proceeds to step 163, which corresponds to the CRC check 105 described above, and, therefore, step 163 also is not described in detail here. On the other hand, if the threshold test of step 162 fails, rather than immediately checking for the final iteration (as in the technique of FIG. 5), processing transfers to section 170 to determine whether the transmission format assumption can be immediately rejected.

More specifically, in step 171 $P_0$ is compared against a threshold Th(rate). If $P_0$>Th(rate), then processing immediately proceeds to step 172, in which the assumed format is deselected and processing is halted with respect to the currently assumed transmission format. The process of FIG. 8 can then be run with a different assumed transmission format. On the other hand, if the assumed format cannot be immediately rejected in step 171 (i.e., $P_0 \leq$Th(rate)), then processing proceeds to step 191, where processing proceeds either to the next iteration at step 161 or (if at the last iteration) to step 192. As to the thresholding test of step 171, it is noted that if the transmission format assumption is incorrect, then the resulting data likely will be fairly random, meaning that the threshold Th(rate) can be set to a value that is just below 0.5, e.g., to a value of 0.4 or 0.3.

Returning to processing section 160, if the CRC check of step 163 passes then the assumed format is selected (i.e., confirmed) in step 183 and the iterations of decoder 82 can be halted with confidence that the data block has been decoded correctly. On the other hand, if the CRC check of step 163 fails, then processing proceeds to step 165.

In step 165 (which corresponds to step 107 of FIG. 5), a determination is made as to whether the current iteration is the final iteration. If not, processing proceeds to step 161 to begin the next iteration. If so, processing proceeds to step 181 in processing section 180 in order to determine whether the assumed format at least can be confirmed (even if the current data block cannot be decoded with sufficient confidence).

In this regard, in step 181 $P_0$ is compared against a threshold Th(BER), e.g., a target decoding error rate of $1.9*10^{-5}$. If $P_0$<Th(BER), then processing proceeds to step 183 in which the assumed format is confirmed and processing is halted. On the other hand, if $P_0 \geq$Th(BER) Then processing proceeds to step 192 in which the assumed format is tagged as "uncertain" and processing is halted. It is noted that step 191 is identical to step 165 except that it is not necessary to perform the test of step 181 after step 191 because the test in step 171 already failed.

As indicated above, the foregoing technique can result in any of the following outcomes: (i) decoder 82 is halted prior to the maximum number of iterations with the conclusion that the data block has been decoded with a sufficient level of confidence and the assumed data transmission format has been confirmed; (ii) decoder 82 is halted because a determination has been made that the transmission format assumption is incorrect, in which case the received data block can be reprocessed using a different transmission format assumption and using the processing of FIG. 8; (iii) decoder 82 is halted because the current data block cannot be decoded with adequate confidence, but the transmission format has been confirmed, in which case other received data blocks can be processed using the confirmed transmission format and the technique of FIG. 5 and a request can be issued to resend the current data block; or (iv) the current data block cannot be decoded with sufficient confidence and the data transmission format can neither be confirmed nor rejected, in which case the current data block can be processed using other possible transmission format assumptions, other received data blocks can be processed using the current or other transmission format assumptions (e.g., using the processing of FIG. 5 or the processing of FIG. 8), and a request can be issued to resend the current data block.

In connection with such processing, the technique of FIG. 8 uses two additional thresholds, as compared with the technique of FIG. 5. Both of Th(BER) and Th(rate), like the specified maximum undetected error rate, preferably are included in the control parameters 87 that are input into system 80, e.g., by a user or by another automated process that varies such parameter on a dynamic basis in an attempt to achieve optimal performance under varying conditions. In the embodiment described above, Th(CRC), having a value of $\approx 6*10^{-4}$, is less than Th(rate), having a value of 0.4 or 0.3, and Th(BER), having a value of $1.9*10^{-5}$, is less than Th(CRC).

Mathematical Discussion; Derivation of $P_0$ Estimation.

Let $U=(u_1,u_2,\ldots,u_K)$ be the K information bits of a data block, and $C=(c_1,c_2,\ldots,c_N)$ be the encoded N coded symbols from information vector U. After transmission through channel, the received vector is $y=(y_1,y_2,\ldots,y_N)$. At the receiver, turbo decoding is applied and a decision is made on the transmitted information bits, obtaining an estimated information vector $\hat{U}=(\hat{u}_1,\hat{u}_2,\ldots,\hat{u}_K)$ The entire turbo code channel from the turbo encoder, through the transmission channel, and ending at the output of the turbo decoder can be viewed as a binary symmetric channel (BSC) with crossover probability $P_0$ (i.e., the probability that a transmitted bit will be incorrectly identified as its inverse at the receiver). An iterative decoding algorithm using a maximum a posteriori (MAP) criterion needs to obtain the following variable from the received vector y:

$$L(\hat{u}_k|y) = \log\frac{P(u_k = +1|y)}{P(u_k = -1|y)},$$

upon which the MAP algorithm makes the decision as follows:

$$\hat{u}_k = \text{sign}(L(\hat{u}_k|y)).$$

The MAP criterion therefore implies that at the end of each iteration, if a decision is made:

$$P(\hat{u}_k=+1|y)=P(u_k=+1|y)$$

$$P(\hat{u}_k=-1|y)=P(u_k=-1|y)$$

Let observation y be based on two hypotheses, transmitted with $u_k=+1$ or transmitted with $u_k=-1$. Then, y can be represented by two conditional pdf's $f_Y(y|u_k=+1)$ and $f_Y(y|u_k=-1)$. Define the following two terms:

$$E_{L+}\{P\hat{u}_k = +1|y)\} \equiv \int_{Y\in S+} f_Y(y)P(\hat{u}_k = +1|y)dy$$

$$S+=\{y: L(\hat{u}_k|y) > 0\} \text{ and}$$

$$E_{L-}\{P\hat{u}_k = -1|y)\} \equiv \int_{Y\in S-} f_Y(y)P(\hat{u}_k = -1|y)dy$$

$$S-=\{y: L(\hat{u}_k|y) < 0\}.$$

Then, with the assumption of an equally probable source:

$$E_{L+}\{P(\hat{u}_k = +1|y)\} = \int_{Y\in S+} P(u_k = +1)f_Y(y|u_k = +1) \quad (1.1)$$

$$P(\hat{u}_k = +1|y)dy + \int_{Y\in S+} P(u_k = -1)f_Y$$

$$(y|u_k = -1)P(\hat{u}_k = +1|y)dy$$

$$= \frac{1}{2}\int_{Y\in S+} f_Y(y|u_k = +1)P(\hat{u}_k = +1|y)dy +$$

$$\frac{1}{2}\int_{Y\in S+} f_Y(y|u_k = -1)P(\hat{u}_k = +1|y)dy$$

$$= \frac{1}{2}\int_Y f_Y(y|u_k = +1)P(\hat{u}_k = +1|y)dy -$$

$$\frac{1}{2}\int_{Y\in S-} f_Y(y|u_k = +1)P(\hat{u}_k = +1|y)dy +$$

$$\frac{1}{2}\int_{Y\in S+} f_Y(y|u_k = -1)P(\hat{u}_k = +1|y)dy$$

Similarly:

$$E_{L-}\{P(\hat{u}_k = -1|y)\} = \int_{Y\in S-} P(u_k = +1)f_Y(y|u_k = +1) \quad (1.2)$$

$$P(\hat{u}_k = -1|y)dy + \int_{Y\in S-} P(u_k = -1)f_Y$$

$$(y|u_k = -1)P(\hat{u}_k = -1|y)dy$$

$$= \frac{1}{2}\int_{Y\in S-} f_Y(y|u_k = +1)P(\hat{u}_k = -1|y)dy +$$

$$\frac{1}{2}\int_{Y\in S-} f_Y(y|u_k = -1)P(\hat{u}_k = -1|y)dy$$

$$= \frac{1}{2}\int_Y f_Y(y|u_k = -1)P(\hat{u}_k = -1|y)dy -$$

$$\frac{1}{2}\int_{Y\in S+} f_Y(y|u_k = -1)P(\hat{u}_k = -1|y)dy +$$

$$\frac{1}{2}\int_{Y\in S-} f_Y(y|u_k = +1)P(\hat{u}_k = -1|y)dy$$

Summing Eqs. (1.1) and (1.2), we have:

$$E_{L+}\{P(\hat{u}_k = +1|y)\} + E_{L-}\{P(\hat{u}_k = -1|y)\} = (1-P_0) + \quad (1.3)$$

$$\frac{1}{2}$$

$$\int_{y\in S+} f_Y(y|u_k = -1)[P(\hat{u}_k = +1|y) - P(\hat{u}_k = -1|y)]dy -$$

$$\frac{1}{2}\int_{y\in S-} f_Y(y|u_k = +1)[P(\hat{u}_k = +1|y) - P(\hat{u}_k = -1|y)]dy$$

$$=1-P_0$$

The final result is obtained from the symmetric property of the channel and the decoder. Moreover, because $$P(\hat{u}_k = \pm 1|y) = \frac{1}{1+e^{\mp L(\hat{u}_k|y)}},$$

Eq. (1.3) can be written as:

$$E_{L+}\{P(\hat{u}_k = +1|y)\} + E_{L-}\{P(\hat{u}_k = -1|y)\} = E_{L+}\left\{\frac{1}{1+e^{-L(\hat{u}_k|y)}}\right\} +$$

$$E_{L-}\left\{\frac{1}{1+e^{L(\hat{u}_k|y)}}\right\}$$

$$= E_L\left\{\frac{1}{1+e^{-|L(\hat{u}_k|y)|}}\right\}$$

i.e., $$P_0 = 1 - E_L\left\{\frac{1}{1+e^{-|L|}}\right\} = E_L\left\{\frac{1}{1+e^{|L|}}\right\}$$

This is the closed-form relationship between the bit error rate $P_0$ and LLR. Because the LLR is an ergodic process as data block size approaches infinity, for an encoded data block with size K that is sufficiently large, the bit error rate can be obtained from the following approximation:

$$P_0 \approx \frac{1}{K}\sum_{k=1}^{K}\left\{\frac{1}{1+e^{|L(\hat{u}_k)|}}\right\}.$$

Advantages and Characteristics of Certain Representative Embodiments

As described in detail above, the present invention provides improved decoders. Some of the characteristics and advantages of certain representative embodiments of the present invention are as follows:

A decoder that is capable of identifying if the data being decoded have been encoded with an assumed parameter.

A decoder in which the decision regarding whether the assumed transmission format is correct is reached by utilizing the built-in CRC (or other built-in error-detection code), and by averaging a function of the magnitude of certain decoding metrics.

Using a particular relationship that enables the decoder to determine the error probability based on the magnitude of one or more decoding metrics.

Using a function of the magnitude of the LLR values (e.g., an average of such function values) to obtain an estimation of decoding error rate, and using this estimation to provide a stop decision, e.g., thereby resulting in a controllable decoding error rate and CRC error detection rate. In addition, when needed, the same decoding error-rate estimation can be used to provide judgment as to whether assumed encoding parameters are correct, incorrect or uncertain.

A decoder that, at the same time of performing decoding, also can provide judgment as to whether the assumed transmission format is correct, incorrect or uncertain.

Using a decoding stop criterion that is based on whether the decoder has achieved an error-free decoding with a specified level of accuracy (e.g., rather than being based on whether a further iteration will change LLR distribution), thereby reducing unnecessary iterations.

System Environment.

Generally speaking, except where clearly indicated otherwise, all of the systems, methods and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a firewire connection, or using a wireless protocol, such as Bluetooth or a 802.11 protocol); software and circuitry for connecting to one or more networks (e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system), which networks, in turn, in many embodiments of the invention, connect to the Internet or to any other networks); a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., the hard disk), are downloaded into RAM and then are executed by the CPU out of RAM. However, in some cases the process steps initially are stored in RAM or ROM.

Suitable devices for use in implementing the present invention may be obtained from various vendors. In the various embodiments, different types of devices are used depending upon the size and complexity of the tasks. Suitable devices include mainframe computers, multiprocessor computers, workstations, personal computers, and even smaller computers such as PDAs, wireless telephones or any other appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented in software, hardware, firmware or any combination of these, with the particular implementation being selected based on known engineering tradeoffs. More specifically, where the functionality described above is implemented in a fixed, predetermined or logical manner, it can be accomplished through programming (e.g., software or firmware), an appropriate arrangement of logic components (hardware) or any combination of the two, as will be readily appreciated by those skilled in the art.

It should be understood that the present invention also relates to machine-readable media on which are stored program instructions for performing the methods and functionality of this invention. Such media include, by way of example, magnetic disks, magnetic tape, optically readable media such as CD ROMs and DVD ROMs, or semiconductor memory such as PCMCIA cards, various types of memory cards, USB memory devices, etc. In each case, the medium may take the form of a portable item such as a miniature disk drive or a small disk, diskette, cassette, cartridge, card, stick etc., or it may take the form of a relatively larger or immobile item such as a hard disk drive, ROM or RAM provided in a computer or other device.

The foregoing description primarily emphasizes electronic computers and devices. However, it should be understood that any other computing or other type of device instead may be used, such as a device utilizing any combination of electronic, optical, biological and chemical processing.

Additional Considerations.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. A method for decoding a communication signal including a plurality of bits, wherein the plurality of bits include information bits and an embedded error-detection code, the method comprising:
    (a) decoding the communication signal on an iterative basis, wherein each iteration of said decoding produces soft estimates for the plurality of bits, and also produces decisions regarding the plurality of bits based on the soft estimates;
    (b) during each iteration, calculating a measure of bit error rate based on the soft estimates;
    (c) during each iteration at which the measure of bit error rate passes a specified threshold test, determining whether there is a detectable error in the decisions based on a portion of the decisions corresponding to the embedded error-detection code; and
    (d) stopping the iterations of the iterative decoding based on both of the following conditions occurring: (i) it is determined that there is no detectable error in the decisions based on said portion of the decisions corresponding to the embedded error-detection code, and (ii) the measure of bit error rate passes the specified threshold test, wherein the specified threshold test uses a specified threshold that is calculated in a predetermined manner based on a type of error-detection code generation.

2. A method according to claim 1, wherein the iterative decoding is a turbo decoding.

3. A method according to claim 1, wherein the soft estimates comprise inputs into a hard-decision making step for outputting the decisions regarding the plurality of bits at each iteration.

4. A method according to claim 3, wherein the measure of bit error rate comprises an average of a plurality of function values, wherein each of the function values is computed from a corresponding one of the soft estimates.

5. A method according to claim 1, wherein the specified threshold corresponds to a specified error rate associated with the embedded error-detection code.

6. A method according to claim 1, further comprising a step of stopping the iterations performed by the iterative decoding and outputting an error code after a specified maximum number of iterations has been performed and either of the conditions identified in step (d) is not satisfied.

7. A method according to claim 1, wherein the measure of bit error rate is calculated as:

$$P_0 = \frac{1}{K} \sum_{k=1}^{K} \left\{ \frac{1}{1 + e^{|L(\hat{u}_k)|}} \right\},$$

where $P_0$ is the measure of bit error rate, K is a number of the plurality of bits, and $L(\hat{u}_k)$ is a $k^{th}$ one of the soft estimates.

8. A method of simultaneously decoding a communication signal including a plurality of bits and evaluating an assumed transmission format for the communication signal, wherein the plurality of bits include information bits and an embedded error-detection code, comprising:
    (a) decoding the communication signal on an iterative basis, wherein each iteration of said decoding comprises generating soft estimates for the plurality of bits and outputting decisions regarding the plurality of bits, based on an assumed transmission format, wherein the decisions are based on the soft estimates;
    (b) during each iteration, calculating a measure of bit error rate based on the soft estimates;
    (c) during each iteration at which the measure of bit error rate passes a first specified threshold test, determining whether there is a detectable error in the decisions based on a portion of the decisions corresponding to the embedded error-detection code;
    (d) stopping the iterations performed by the iterative decoding and selecting the assumed transmission format based on both of the following conditions occurring: (i) it is determined that there is no detectable error in the decisions based on said portion of the decisions corresponding to the embedded error-detection code, and (ii) the measure of bit error rate passes the first specified threshold test; and
    (e) stopping the iterations performed by of the iterative decoding and de-selecting the assumed transmission format based on the following condition occurring: the measure of bit error rate fails a second specified threshold test.

9. A method according to claim 8, further comprising steps, performed after a specified maximum number of iterations has been performed by the iterative decoding, of:
    stopping the iterations performed by the iterative decoding;
    selecting the assumed transmission format if the measure of bit error rate passes a third specified threshold test; and
    flagging the assumed transmission format as uncertain if the measure of bit error rate fails the third specified threshold test.

10. A method according to claim 9, wherein a first threshold used in the first specified threshold test corresponds to a lower bit error rate than a second threshold used in the second specified threshold test, and wherein a third threshold used in the third threshold test corresponds to a lower bit error rate than the first threshold.

11. A method according to claim 8, further comprising steps, performed after a specified maximum number of iterations has been performed by the iterative decoding, of:
    stopping the iterations performed by the iterative decoding;
    flagging the assumed transmission format as uncertain if either: (i) the measure of bit error rate fails the second specified threshold test, but the measure of bit error rate for the current iteration shows improvement beyond a specified delta threshold when compared with the measure of bit error rate from the previous iteration, or (ii) the measure of bit error rate fails the first specified threshold test, but passes the second specified threshold test.

12. A method according to claim 8, wherein the iterative decoding is a turbo decoding.

13. A method according to claim 8, wherein the soft estimates comprise inputs into a hard-decision making step for outputting the decisions regarding the plurality of bits at each iteration.

14. A method according to claim 13, wherein the measure of bit error rate comprises an average of a plurality of function values, wherein each of the function values is computed from a corresponding one of the soft estimates.

15. A method according to claim 8, wherein a threshold used in the first specified threshold test corresponds to a specified error rate associated with the embedded error-detection code.

16. A method according to claim 8, wherein the measure of bit error rate is calculated as:

$$P_0 = \frac{1}{K}\sum_{k=1}^{K}\left\{\frac{1}{1+e^{|L(\hat{u}_k)|}}\right\},$$

where $P_0$ is the measure of the bit error rate, K is a number of the plurality of bits, and $L(\hat{u}_k)$ is a $k^{th}$ one of the soft estimates.

17. A system for decoding a communication signal comprising:
  (a) an iterative decoder configured to:
    receive the communication signal, wherein the communication signal comprises a plurality of bits, wherein the plurality of bits include information bits and an embedded error code; and
    decode the communication signal on an iterative basis, wherein each iteration of said decoding includes generating soft estimates for the plurality of bits and outputting decisions regarding the plurality of bits based on the soft estimates;
  (b) an error detector configured to determine, during each iteration, whether there is a detectable error in the decisions based on a portion of the decisions corresponding to the embedded error-detection code; and
  (c) an iteration controller configured to:
    (i) calculate, during each iteration, a measure of bit error rate based on soft estimates; and
    (ii) stop the iterations performed by the iterative decoder based on both of the following conditions occurring: (1) the error detector determines that there is no detectable error in the decisions, and (2) the measure of bit error rate passes a specified threshold test, wherein the specified threshold test uses a threshold that is calculated in a predetermined manner based on a type of error-detection code generation.

18. A system according to claim 17, wherein the soft estimates comprise inputs into a hard-decision thresholder of the iterative decoder.

19. A system according to claim 17, wherein the threshold corresponds to a specified error rate associated with the embedded error-detection code.

20. A system according to claim 17, wherein the measure of bit error rate is calculated as:

$$P_0 = \frac{1}{K}\sum_{k=1}^{K}\left\{\frac{1}{1+e^{|L(\hat{u}_k)|}}\right\},$$

where $P_0$ is the measure of bit error rate, K is a number of the plurality of bits, and $L(\hat{u}_k)$ is a $k^{th}$ one of the soft estimates.

21. A method for decoding a communication signal received from a channel, wherein the communication signal is a channel-distorted version of a transmit signal that is transmitted onto the channel, wherein the transmit signal is itself a result of a process that encodes a plurality of bits into the transmit signal, wherein the plurality of bits include information bits and an embedded error-detection code, the method comprising:
  (a) decoding the communication signal on an iterative basis, wherein each iteration of said decoding produces soft estimates for the plurality of bits and also produces decisions based on the soft estimates, wherein the decisions comprise binary estimates of the plurality of bits, wherein the decisions include a first subset of decisions that correspond to the information bits and a second subset of decisions that correspond to the embedded error-detection code;
  (b) during each iteration, calculating a measure of bit error rate based on the soft estimates;
  (c) during each iteration at which the measure of bit error rate is less than a specified threshold, operating on the first subset of decisions according to a specified algorithm for error-detection code generation to generate a computed error-detection code, and determining if the computed error-detection code matches the second subset of decisions; and
  (d) stopping the iterations of the iterative decoding based on both of the following conditions occurring: (i) it is determined that the computed error-detection code matches the second subset of decisions, and (ii) the measure of bit error rate is less than the specified threshold, wherein the specified threshold is calculated in a predetermined manner based on the specified algorithm for error-detection code generation.

* * * * *